US011417825B2

(12) United States Patent
Yoshida et al.

(10) Patent No.: US 11,417,825 B2
(45) Date of Patent: Aug. 16, 2022

(54) PIEZOELECTRIC LAMINATE ELEMENT, AND LOAD SENSOR AND POWER SUPPLY USING SAME

(71) Applicants: MURATA MANUFACTURING CO., LTD., Nagaokakyo (JP); KANSAI UNIVERSITY, Suita (JP); Panasonic Intellectual Property Management Co., Ltd., Osaka (JP)

(72) Inventors: Tetsuo Yoshida, Tokyo-to (JP); Yoshiro Tajitsu, Osaka-fu (JP); Atsuko Kato, Osaka-fu (JP); Hiroki Takeoka, Nara-ken (JP); Yukihiro Shimasaki, Hyogo-ken (JP)

(73) Assignees: MURATA MANUFACTURING CO., LTD., Nagaokakyo (JP); KANSAI UNIVERSITY, Suita (JP); Panasonic Intellectual Property Management Co., Ltd., Osaka (JP)

( * ) Notice: Subject to any disclaimer, the term of this patent is extended or adjusted under 35 U.S.C. 154(b) by 503 days.

(21) Appl. No.: 16/462,379

(22) PCT Filed: Nov. 7, 2017

(86) PCT No.: PCT/JP2017/040145
§ 371 (c)(1),
(2) Date: May 20, 2019

(87) PCT Pub. No.: WO2018/096924
PCT Pub. Date: May 31, 2018

(65) Prior Publication Data
US 2019/0341541 A1 Nov. 7, 2019

(30) Foreign Application Priority Data
Nov. 22, 2016 (JP) .............................. JP2016-227273

(51) Int. Cl.
*H01L 41/193* (2006.01)
*H01L 41/083* (2006.01)
(Continued)

(52) U.S. Cl.
CPC ............ *H01L 41/0836* (2013.01); *G01L 1/16* (2013.01); *H01L 41/0472* (2013.01);
(Continued)

(58) Field of Classification Search
CPC ....... H02N 2/18; H01L 41/113; H01L 41/047; H01L 41/083; H01L 41/193; H01L 41/0836; H01L 41/0472; H01L 41/1132
See application file for complete search history.

(56) References Cited

U.S. PATENT DOCUMENTS 5,559,387 A * 9/1996 Beurrier .............. H01L 41/0926
310/328
2004/0217671 A1* 11/2004 Rosenthal ............. A61M 5/142
310/328
(Continued)

FOREIGN PATENT DOCUMENTS

JP         5-75634 U      10/1993
JP       2003-106911 A     4/2003
(Continued)

OTHER PUBLICATIONS

International Search Report for PCT/JP2017/041045 dated Dec. 5, 2017 [PCT/ISA/210].

*Primary Examiner* — J. San Martin
(74) *Attorney, Agent, or Firm* — Sughrue Mion, PLLC

(57) ABSTRACT

Provided is a piezoelectric laminate element that outputs a fixed output voltage even in response to a static load for which an output voltage could not be obtained using a conventional piezoelectric element. A piezoelectric laminate body in which a plurality of piezoelectric polymer film layers consisting of film such as polylactic acid film that exhibits piezoelectricity in the planar direction are laminated is used as a piezoelectric laminate element. The piezoelectric laminate body is given a cylindrical shape, rounded rectangle shape, or other partially curved shape. The output (Continued)

voltage follows the increase and decrease of the applied load, and if a fixed load is continuously applied, a fixed output voltage is continuously output, and a piezoelectric laminate element is obtained that outputs a fixed output voltage even if a load is static.

12 Claims, 9 Drawing Sheets

(51) Int. Cl.
*G01L 1/16* (2006.01)
*H01L 41/047* (2006.01)
*H01L 41/113* (2006.01)
*H02N 2/18* (2006.01)

(52) U.S. Cl.
CPC ........ *H01L 41/1132* (2013.01); *H01L 41/193* (2013.01); *H02N 2/186* (2013.01)

(56) References Cited

U.S. PATENT DOCUMENTS

| | | | |
|---|---|---|---|
| 2010/0194243 A1* | 8/2010 | Yoneyama | F16L 55/0333 310/338 |
| 2011/0109204 A1* | 5/2011 | Tajitsu | H01L 41/094 310/348 |
| 2015/0357554 A1* | 12/2015 | Krause | H01L 41/193 428/423.1 |
| 2016/0005951 A1 | 1/2016 | Yoshida et al. | |
| 2016/0077649 A1* | 3/2016 | Ando | G02B 5/3025 345/174 |
| 2016/0299625 A1* | 10/2016 | Kano | G06F 3/0446 |
| 2020/0276018 A1* | 9/2020 | Nguyen | A61L 27/52 |
| 2021/0127998 A1* | 5/2021 | Nguyen | A61B 5/031 |

FOREIGN PATENT DOCUMENTS

| | | |
|---|---|---|
| JP | 2014-27038 A | 2/2014 |
| JP | 5671192 B2 | 2/2015 |
| WO | 2016/027615 A1 | 2/2016 |

\* cited by examiner

PIEZOELECTRIC LAMINATE ELEMENT, AND LOAD SENSOR AND POWER SUPPLY USING SAME

CROSS REFERENCE TO RELATED APPLICATIONS

This application is a National Stage of International Application No. PCT/JP2017/040145, filed on Nov. 7,2017, which claims priority from Japanese Patent Application No. 2016-227273, filed on Nov. 22, 2016.

FIELD

The present invention relates to a multilayer piezoelectric element using a piezoelectric polymer film.

BACKGROUND

Polylactic acid films subjected to stretching are known to be used as polymeric piezoelectric materials by providing the film with a conductive layer. Patent Document 1 proposes a sensor that detects mechanical vibrations by converting to a voltage and a piezoelectric speaker that uses vibrations generated by applying a signal voltage to an electrode by using this type of piezoelectric material.

Since the voltage is output corresponding to the degree of acceleration of displacement in conventional piezoelectric elements, a large output voltage is obtained following the application of a dynamic load that changes instantaneously in a short period of time on the microsecond level. However, in the case of loads that change slowly over the course of several seconds or more or loads that are held constant in the form of static loads, since the degree of acceleration of the displacement of the piezoelectric element becomes small, the output voltage of the piezoelectric element becomes nearly zero thereby making it difficult to detect the load. Therefore, in order to detect a static load in which the output voltage of the piezoelectric element is nearly zero, a piezoelectric sensor provided with a nonlinear deflection member has been proposed in the manner of Patent Document 2, and a load sensor provided with a separate piezoelectric element that generates a dynamic load has been proposed in the manner of Patent Document 3.

CITATION LIST

Patent Document

Patent Document 1: JP2014-27038A
Patent Document 2: JP2003-106911A
Patent Document 3: JPH5-75634U

SUMMARY

Technical Problem

The piezoelectric sensor of Patent Document 2 detects slow changes in a load in the form of an instantaneous change in a nonlinear defection member. Consequently, in order to know that a static load is being continuously applied, a judgment means circuit is required in addition to the piezoelectric element. In addition, the load sensor of Patent Document 3 requires a piezoelectric element that vibrates as a result of being connected to an alternating current power supply and repeatedly expanding and contracting in addition to the piezoelectric element serving as the detecting unit. In this manner, in order to detect a static load with a piezoelectric element, other circuits or elements and the like are required and it is difficult to detect static loads with a piezoelectric element alone.

With the foregoing in view, an object of the present invention is to provide a multilayer piezoelectric element in which a substantially constant output voltage is output continuously corresponding to an applied static load even in the case of a static load for which an output voltage is unable to be obtained with conventional piezoelectric elements.

Solution to Problem

The inventors of the present invention found that, in a laminate obtained by laminating a plurality of layers of a piezoelectric polymer film layer that exhibits piezoelectric properties in the planar direction of the film, a substantially constant voltage is output continuously even after the load has become constant, and as a result of further studies, led to completion of the present invention.

Namely, the present invention includes the following aspects (1) to (11).

(1) The multilayer piezoelectric element of the present invention is provided with a laminate obtained by laminating a plurality of layers of a piezoelectric polymer film layer that exhibits piezoelectric properties in the planar direction of the film, wherein the output voltage follows an increase or decrease of a load applied to the laminate, and the output voltage is substantially constant when the applied load is constant.

(2) In Aspect (1), a cross-section of the piezoelectric polymer film layer at least has a curved portion.

(3) In Aspect (2), a cross-section of the piezoelectric polymer film layer has the curved portion and a linear portion continuous with the curved portion.

(4) In any of Aspects (1) to (3), the piezoelectric polymer film layer is a poly(L-lactic acid) film layer and/or a poly(D-lactic acid) film layer.

(5) In any of Aspects (1) to (4), the laminate is a wound laminate in which a first conductive layer, the piezoelectric polymer film layer, a second conductive layer and an insulating layer are wound.

(6) In Aspect (5), the piezoelectric polymer film layer and the insulating layer are film layers composed of an optically chiral polymer, and the laminate is layered so that the direction indicating piezoelectric properties when a voltage is applied to the piezoelectric polymer film layer and the direction indicating piezoelectric properties when a voltage opposite of that voltage is applied to the insulating layer are in the same direction.

(7) In Aspect (5) or (6), a first electrode exhibiting electrical continuity with the first conductive layer is formed on one of the lateral surfaces of the wound laminate, and a second electrode exhibiting electrical continuity with the second conductive layer is formed on the other lateral surface of the wound laminate.

(8) In any of Aspects (5) to (7), the central portion of the wound laminate does not have a space.

(9) In any of Aspects (5) to (7), the central portion of the wound laminate has a space.

(10) In any of Aspects (5) to (7), a core member is inserted into the central portion of the wound laminate.

(11) In any of Aspects (5) to (7), hardness as measured with an Asker Durometer Type C manufactured by Kobunshi Keiki Co., Ltd. is within the range of 70 to 100.

(12) In any of Aspects (1) to (11), the number of layers of the piezoelectric polymer film layer is 80 layers or more.

(13) In addition, the load sensor of the present invention includes the multilayer piezoelectric element described in any of Aspects (1) to (12) and a detection device connected to the multilayer piezoelectric element that detects the output thereof.

(14) In addition, the power supply of the present invention uses the multilayer piezoelectric element described in any of Aspects (1) to (12).

Advantageous Effects of Invention

According to the present invention, a multilayer piezoelectric element can be provided in which a substantially constant output voltage is output continuously corresponding to an applied static load even in the case of a static load for which an output voltage is unable to be obtained with a piezoelectric element of the prior art.

DESCRIPTION OF EMBODIMENTS

The multilayer piezoelectric element of the present invention is characterized by comprising a laminate in which a plurality of piezoelectric polymer films that exhibit piezoelectric properties in the planar direction of the films are laminated, wherein the output voltage follows an increase or decrease of a load applied to the laminate, and the output voltage is substantially constant when the applied load is constant. In the present invention, the output voltage being substantially constant with respect to a constant load refers to a voltage of the same polarity being continued to be output continuously for several seconds or more during the time a constant load is applied. In the case the output voltage decreases over time during the time the constant load is applied, the reduction rate of the output voltage for 5 seconds is 50% or less. If the reduction rate of the output voltage for 5 seconds is 50% or less, the output voltage is substantially constant since continuous application of the load can be determined from the output voltage as a result of a voltage of the same polarity being continued to be output. The multilayer piezoelectric element of the present invention is able to provide a substantially constant output voltage when an applied load is constant without containing another means for detecting a static load.

The piezoelectric polymer film in the present invention is a piezoelectric polymer film that exhibits piezoelectric properties in the planar direction of the film. In addition, the multilayer piezoelectric element is provided with a piezoelectric laminate that is laminated so that a curved portion is formed in at least a portion of a cross-section of a piezoelectric polymer film layer that exhibits piezoelectric properties in the planar direction of the film. When a load is applied to the multilayer piezoelectric element, stress occurs in the direction of thickness and planar direction of the piezoelectric polymer film. In the multilayer piezoelectric element of the present invention, strain attributable to stress in the planar direction is generated continuously along the curved portion even after the load has become constant, and output voltage is thought to be maintained continuously for a long period of time of several seconds or more as a result thereof.

Figure 1A:
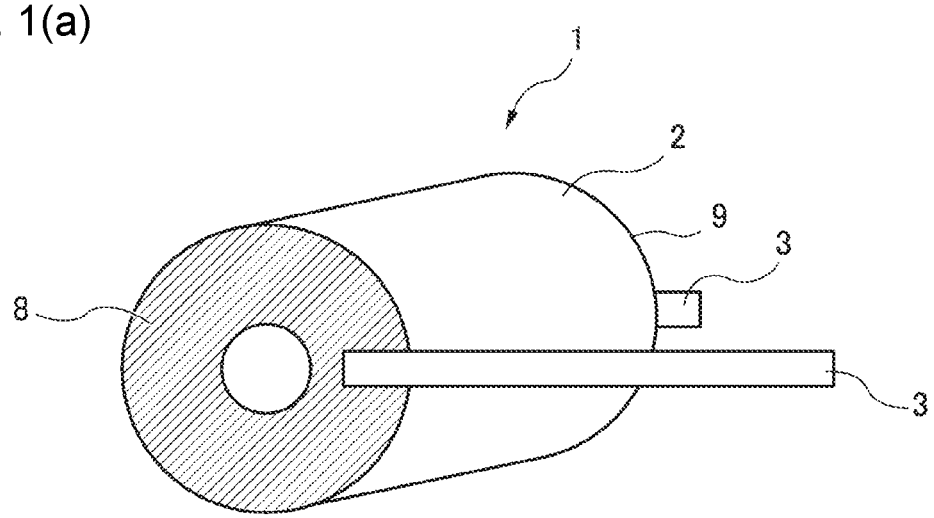
FIG. 1(a) and FIG. 1(b) are drawings schematically showing a multilayer piezoelectric element.
Figure 1B:
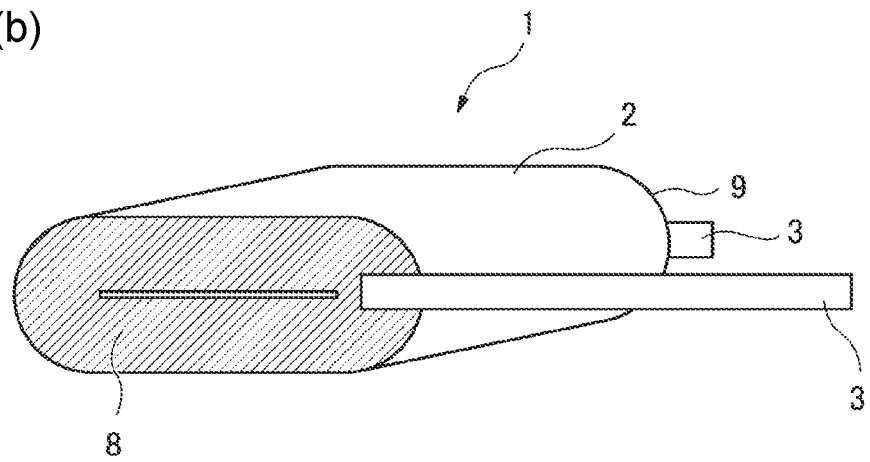

The following provides an explanation of embodiments of the present invention with reference to the drawings. FIG. 1(a) and FIG. 1(b) are drawings schematically showing a multilayer piezoelectric element 1 of an embodiment of the present invention. In the multilayer piezoelectric element 1 of the present embodiment, a first electrode 8 and a second electrode 9 are formed on the lateral surfaces of a piezoelectric laminate 2, in which a piezoelectric polymer film exhibiting piezoelectric properties in the planar direction of the film is wound to obtain a wound laminate, and a lead-out electrode 3 is arranged therein. The shape of the piezoelectric laminate 2 may be cylindrical as in FIG. 1(a) or may that of a rounded rectangle in which the shape of the lateral surfaces has a curved portion and a linear portion continuous with the curved portion as shown in FIG. 1(b).

The rounded rectangular piezoelectric laminate 2 can be produced by winding the piezoelectric polymer film into a cylindrical shape followed by pressing. In the case of the rounded rectangular shape as shown in FIG. 1(b), since flat portions are present on the top and bottom, it is easy to stably install the multilayer piezoelectric element 1 and the multilayer piezoelectric element 1 can be used as a pedestal to which a load is applied. During pressing, pressing may be carried out so as not to leave a space in the central portion of the multilayer piezoelectric element 1 or pressing may be carried out so as to leave a space.

In addition, a wound laminate may also be formed by inserting a core member into the central portion of the multilayer piezoelectric element 1. Although there are no particular limitations on the core member, examples include materials having flexibility in the manner of rubber materials such as urethane rubber, silicon rubber or propylene rubber, elastomers such as acrylic elastomers, urethane elastomers or polyester elastomers, or plastic materials obtained by adding a plasticizer such as soft polyvinyl chloride, porous materials in the manner of Styrofoam or sponge, and hard materials such as wood, metal, ceramics, hard polyvinyl chloride, acrylic or polycarbonate. In addition, various types of materials may be combined in addition to being used alone. However, a flexible material is preferable. In addition, there are no particular limitations on shape, and the shape may be that of a cylinder, elliptic cylinder or polygon, or may be an irregular shape.

Figure 2A:
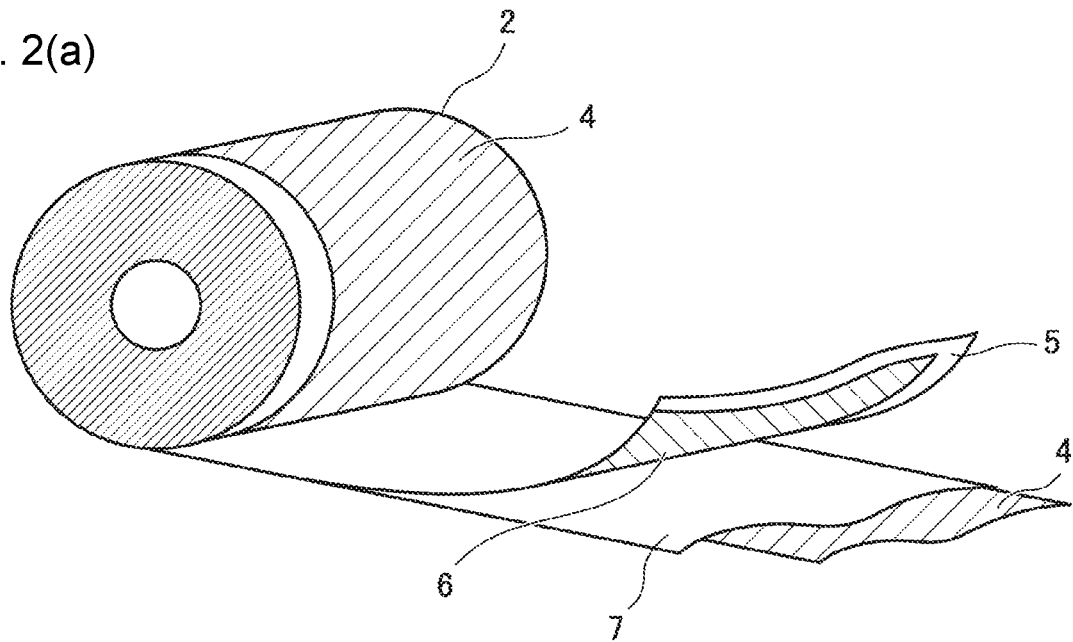
FIG. 2(a) and FIG. 2(b) are drawings showing the layer composition of a multilayer piezoelectric element.
Figure 2B:
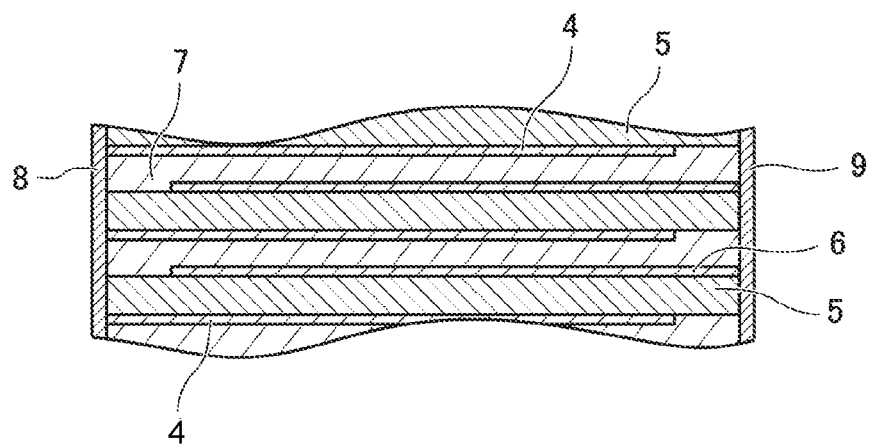

As schematically shown in FIG. 2(a), the piezoelectric laminate 2 is a laminate in which a long first conductive layer 4, a piezoelectric polymer film layer 5, a second conductive layer 6 and an insulating layer 7 are wound on top of each other. A portion of the laminated structure of the piezoelectric laminate 2 is shown in FIG. 2(b). A structure in which the first conductive layer 4, the piezoelectric polymer film layer 5, the second conductive layer 6 and the insulating layer 7 are laminated in that order as a result of winding is repeatedly laminated a plurality of times. A first electrode 8 and a second electrode 9 are formed on the lateral surfaces of the piezoelectric laminate 2, and a voltage signal generated in the piezoelectric polymer film layer 5 is output from the lead-out electrode 3 attached to the first electrode 8 and the second electrode 9.

As shown in FIG. 2(a) and FIG. 2(b), the first conductive layer 4 and the second conductive layer 6 are respectively formed to as to leave a gap between itself and one end or the other end of the piezoelectric polymer film layer 5. More specifically, although the first conductive layer 4 is exposed on the lateral surface of the piezoelectric laminate 2 on the side of the first electrode 8, it is not exposed on the side of the second electrode 9. On the other hand, the second conductive layer 6 is exposed on the lateral surface of the piezoelectric laminate 2 on the side of the second electrode 9 but is not exposed on the lateral surface on the side of the first electrode 8. Consequently, the first electrode 8 electrically connected to the first conductive layer 4 and the second electrode 9 electrically connected to the second conductive layer 6 can be formed by carrying out electrode formation by spraying (metallizing), plating or depositing a conductive substance to a lateral surface of the piezoelectric laminate 2 after winding, or by carrying out electrode formation using an easily deformable material such as conductive rubber. Furthermore, a material such as aluminum, zinc, tin, lead, nickel, iron, copper, brass or an alloy thereof can be used for the material of the first electrode 8 and the second electrode 9. In addition, the first electrode 8 and the second electrode 9 may also be formed by coating with a conductive paste or conductive adhesive or adhering a conductive sheet thereto.

The piezoelectric polymer film layer 5 is formed with a piezoelectric polymer film exhibiting piezoelectric properties in the planar direction of the film. Namely, the piezoelectric polymer film layer 5 generates a potential difference in the direction of film thickness as a result of force being applied in the planar direction of the film. Examples of piezoelectric polymer films exhibiting piezoelectric properties in the planar direction of the film include optically chiral polymers in the form of poly(L-lactic acid) (PLLA) film and poly(D-lactic acid) (PDLA) film. Furthermore, polyvinylidene fluoride (PVDF) films are not piezoelectric polymer films that exhibit piezoelectric properties in the planar direction of the film. PLLA and PDLA do not exhibit piezoelectric properties in the direction of thickness due to ionic polarization in the manner of polyvinylidene fluoride (PVDF), but rather have the properties of exhibiting piezoelectric properties in the planar direction of the film by orientation in a prescribed axial direction.

The thickness of a single layer of the piezoelectric polymer film layer 5 may be 0.5 µm or more, 1 µm or more, 3 µm or more, 5 µm or more or 10 µm or more, or 100 µm or less, 50 µm or less, 30 µm or less, 25 µm or less, 20 µm or less, 15 µm or less, 10 µm or less or 8 µm or less.

The direction in which piezoelectric properties are exhibited by an oriented film of PLLA is the main orientation direction in the oriented film layer, or simply speaking, is the direction at an angle of 45° to the stretched direction of the film. In the case of applying a voltage in the direction of thickness of an oriented film layer of PLLA, piezoelectric properties are exhibited as shear deformation in the direction at an angle of 45° to the stretched direction of the film.

The optical purity of a piezoelectric polymer film exhibiting piezoelectric properties in the planar direction of the film in the form of poly(L-lactic acid) (PLLA) or poly(D-lactic acid) (PDLA) is 80 mol % or more. If optical purity is 80 mol % or more, a high level of piezoelectric properties is exhibited and the effect of the present invention is easily manifested. The optical purity of the polylactic acid is preferably 90 mol % or more, more preferably 95 mol % or more and even more preferably 98 mol % or more. Poly(L-lactic acid) substantially composed only of L-lactic acid units or poly(D-lactic acid) substantially composed only of D-lactic acid units is particularly preferable. Optical purity is determined according to the method indicated below.

First, 0.1 g of sample is weighed out into a polypropylene tube followed by the addition of 1 mL of methanol and 1 mL of a 5 mol/L aqueous sodium hydroxide solution. Next, the aforementioned tube containing the sample solution is placed in a water bath at a temperature of 60° C. followed by stirring for 30 minutes until the sample is completely hydrolyzed. Moreover, after cooling the aforementioned sample solution to room temperature, the sample solution is neutralized by adding 0.25 mol/L sulfuric acid followed by dispensing 0.1 mL of the sample solution into a 9 cc tube with a screw-on cap and using 3 mL of the mobile phase to prepare an HPLC sample solution. Finally, 5 µL of the HPLC sample solution are injected into an HPLC apparatus followed by calculating the amount of the L form and the amount of the D form by determining the peak areas of the D and L forms of polylactic acid and then calculating optical purity using the equation indicated below.

$$\text{Optical purity (\% } ee)=100\times|L\text{ form}-D\text{ form}|/(L\text{ form}+D\text{ form})$$

A copolymer of PLLA or PLDA and another monomer can be used in the piezoelectric polymer film layer 5. The content of a unit other than a L- (D-) lactic acid unit is preferably 0 mol % to 10 mol %, more preferably 0 mol % to 5 mol %, and even more preferably 0 mol % to 2 mol %.

The insulating layer 7 is a layer for electrically insulating the first conductive layer 4 and the second conductive layer 6, and a commonly used insulating material can be used. For example, a polypropylene-based resin film such as a biaxially oriented polypropylene film (OPP) or polyethylene-based resin film such as polyethylene terephthalate (PET) can be used for the insulating film 7.

In addition, a laminated structure consisting of the first conductive layer 4, the first piezoelectric polymer film layer 5, the second conductive layer 6 and a second piezoelectric polymer film layer 7 may be employed by using a piezoelectric polymer film exhibiting piezoelectric properties in the planar direction of the film for the insulating layer 7 as well. For example, a PLLA layer is used for the first piezoelectric polymer film layer 5 and a PDLA layer is used for the second piezoelectric polymer film layer 7. The layers are then laminated so that the direction in which piezoelectric properties are exhibited when a voltage is applied in the direction of thickness of the PLLA layer and the direction in which piezoelectric properties are exhibited when an opposite voltage thereto is applied in the direction of thickness of the PDLA layer are the same direction. In other words, the PLLA layer and the PLDA layer are laminated so that exact opposite loads are generated in the direction of thickness in response to deformation in the same direction. If laminated in this manner, a larger output voltage can be obtained without the load generated in the PLLA layer and the load generation in the PLDA layer cancelling each other out.

In the case of using a PLLA layer or a PLDA layer for both the first piezoelectric polymer film layer 5 and the second piezoelectric polymer film layer 7, the first piezoelectric polymer film layer 5 and the second piezoelectric polymer film layer 7 are laminated so that exact opposite loads are generated in the direction of thickness in response to deformation in the same direction by adjusting the stretching direction of the film during lamination. If laminated in this manner, a larger output voltage can be obtained without the generated loads mutually cancelling each other out.

Although there are no particular limitations on the materials of the first conductive layer 4 and the second conductive layer 6 provided they are conductive materials, at least one type of metal selected from the group consisting of indium, tin, zinc, gallium, antimony, titanium, silicon, zirconium, magnesium, aluminum, gold, silver, copper, palladium and tungsten, or an oxide of at least one type of metal selected from the aforementioned group, is used preferably. Although there are no particular limitations on the method used to form the first conductive layer 4 and the second conductive layer 6, vapor deposition or sputtering is used preferably in order to form with uniform conductivity. For example, if aluminum is used for the conductive material and an aluminum layer is deposited on the surface of a piezoelectric polymer film by vapor deposition or sputtering, heat damage to the piezoelectric polymer film can be inhibited and productivity is superior since deposition can be carried out at a comparatively low temperature. In addition, the aluminum layer can be provided with a coating improving adhesion before depositing the aluminum layer. Furthermore, in addition to these means, the first conductive layer 4 and the second conductive layer 6 may also be formed by coating with a conductive paste or conductive adhesive or by laminating conductive sheets such as metal foil.

Although there are no particular limitations on the thickness of the first conductive layer 4 and the second conductive layer 6, a thickness is selected so that the surface resistance value thereof is preferably $1 \times 10^4 \Omega$/square or less, more preferably $5 \times 10^3 \Omega$/square or less and even more preferably $1 \times 10^3 \Omega$/square or less, and for example, thickness is preferably 15 nm or more. Moreover, thickness is preferably 20 nm to 200 nm and more preferably 20 nm to 100 nm from the viewpoints of conductivity and ease of layer formation. In the case of such a thickness, surface resistance value becomes low and it becomes easier to obtain a continuous film. In addition, it also becomes easy to form the piezoelectric laminate by winding without causing damage to the piezoelectric film attributable to heat generated during deposition, and interlayer strength of the piezoelectric laminate tends to be able to be secured.

The piezoelectric laminate 2 can be produced by the same method used to produce a wound capacitor. For example, the piezoelectric laminate 2 is formed by superimposing a film, formed by depositing the first conductive layer 4 on one side of the piezoelectric polymer film and depositing the second conductive layer 6 on the other side, on film for the insulating layer 7 and winding onto a bobbin.

The number of laminated layers of the piezoelectric polymer film layer 5 is preferably 80 or more. Here, the number of laminated layers refers to the number of layers of the piezoelectric polymer film layer 5 laminated in the radial direction of the piezoelectric laminate 2, and is equivalent to twice the number of windings. If the number of laminated layers is 80 or more, a stable output voltage tends to be obtained. The number of laminated layers is more preferably 400 or more and even more preferably 800) or more. If the number of laminated layers is 400 or more, favorable maintenance of output voltage is obtained, and a result of further making the number of laminated layers to be 800 or more, load response of output voltage to an applied load can be enhanced. The number of laminated layers of the piezoelectric polymer film layer 5 may be 5000 layers or less, 4000 layers or less, 3000 layers or less, 2000 layers or less or 1500 layers or less.

In addition, the hardness of the piezoelectric laminate 2 as measured with an Asker Durometer Type C (manufactured by Kobunshi Keiki Co., Ltd.) is preferably within the range of 70 to 100 since this allows the obtaining of a stable output. If hardness is within this range, the amount of restraint between layers of the piezoelectric polymer film becomes suitable and continuous strain attributable to a static load tends to easily applied to the curved portion. In order to obtain a higher output voltage, hardness is preferably made to be within the range of 80 to 95 and more preferably within the range of 83 to 95. On the other hand, in order to shorten the response speed to a change in the load, hardness is preferably made to be within the range of 94 to 100 and more preferably within the range of 95 to 100.

In order to obtain an output voltage that remains stable in response to a static load, in addition to adjusting the number of laminated layers and hardness, it is also preferable to increase the electrostatic capacitance of the multilayer piezoelectric element.

EXAMPLES (1) Example 1

Production of Multilayer Piezoelectric Element

The multilayer piezoelectric element of Example 1 was produced using a poly(lactic acid) (PLLA) film for the piezoelectric polymer film layer 5 exhibiting piezoelectric properties in the planar direction of the film, and using poly(D-lactic acid) for the insulating film 7. Since the PLDA film of the insulating layer 7 is also a piezoelectric polymer film layer exhibiting piezoelectric properties in the planar direction of the film, the laminated structure of Example 1 consists of the first conductive layer 4, the first piezoelectric polymer film layer 5, the second conductive layer 6 and the second piezoelectric polymer film layer 7.

A multilayer film was prepared by superimposing a pair of films consisting of a PLLA film, having a film width of 54 mm and thickness of 9 μm and having the first conductive layer 4 formed on one side and the second conductive layer 6 formed on the other side by aluminum vapor deposition so that the film thickness was 25 nm, and a PLDA film having a thickness of 9 μm and film width of 54 mm. The first conductive layer 4 was formed by providing an insulating margin in the form of a gap of 2 mm from one end of the PLLA film, and the second conductive layer 6 was formed by providing of 2 mm from the other end of the PLLA film. Thus, the overlapping width in the form of the effective electrode width of the first conductive layer 4 and the second conductive layer 6 in opposition with the PLLA film interposed there between is 50.0 mm. The PLLA film and the PLDA film are laminated by adjusting the stretching direction of each film so that the exact opposite loads are generated in the direction of thickness in response to deformation in the same direction.

The prepared multilayer film was wound 500 times and the resulting cylindrical wound body was sandwiched between flat plates from above and below and pressed until there was no longer any space in the center to form a laminate in the shape of a rounded rectangle as shown in FIG. 1(b). Each layer of the rounded rectangular laminate was adhered by thermal lamination, and after having formed a first electrode layer and a second electrode layer on the lateral surfaces of the piezoelectric laminate 2 by aluminum spraying (metallization), heat treatment was carried out to obtain the multilayer piezoelectric element 1 of Example 1. The form of Example 1 is shown in Table 1. The number of laminated layers in Table 1 indicates the number of laminated layers of the PLLA film and is 1000 layers equal to twice the number of windings. The combined number of laminated layers of the PLLA film layer (first piezoelectric polymer film layer 5) and PLDA film layer (second piezoelectric polymer film layer 7) is 2000 layers. In the following examples and comparative examples, the number of laminated layers indicates the number of laminated layers of the PLLA film layer (first piezoelectric polymer film layer 5) unless specifically indicated otherwise.

The external width of the multilayer piezoelectric element 1 is substantially equal to the film width as the value obtained by adding the thickness of the first electrode layer 8 and the second electrode layer 9 on the lateral surfaces to the film width shown in Table 1. The effective electrode width is the width resulting from superimposing the first conductive layer and the second conductive layer in mutual opposition with the PLLA film layer interposed therebetween. Outside length refers to the external length of the rounded rectangular multilayer piezoelectric element 1, and the inside length refers to length of the central portion crushed by pressing. Hardness refers to the average value of three values obtained by allowing the heat-treated multilayer piezoelectric element 1 to stand undisturbed on a stainless steel sheet and measuring three points in the center of the flat surface of the rounded rectangle with an Asker Durometer Type C (manufactured by Kobunshi Keiki Co., Ltd.). Measurement of hardness was carried out in compliance with the hardness tests described in JIS K 7312 and JIS S 6050. Here, the tester consisted of a pressing surface that presses on the surface of the test piece, an indenter that protrudes from a hole in the pressing surface due to spring pressure, and a scale that indicates the distance that the indenter is pushed back by the surface of the test piece as the value of hardness, the diameter of the center hole in the pressing surface was 5.5 mm, the pressing surface was in the shape of a rectangle having dimensions of 44 mm×18 mm, the shape of the indenter was hemispherical having a height of 2.54 mm and diameter of 5.08 mm, the spring load was 539 mN (55 g) when the scale read zero and 8379 mN (855 g) when scale read 100.

Evaluation of Multilayer Piezoelectric Element

Figure 3:
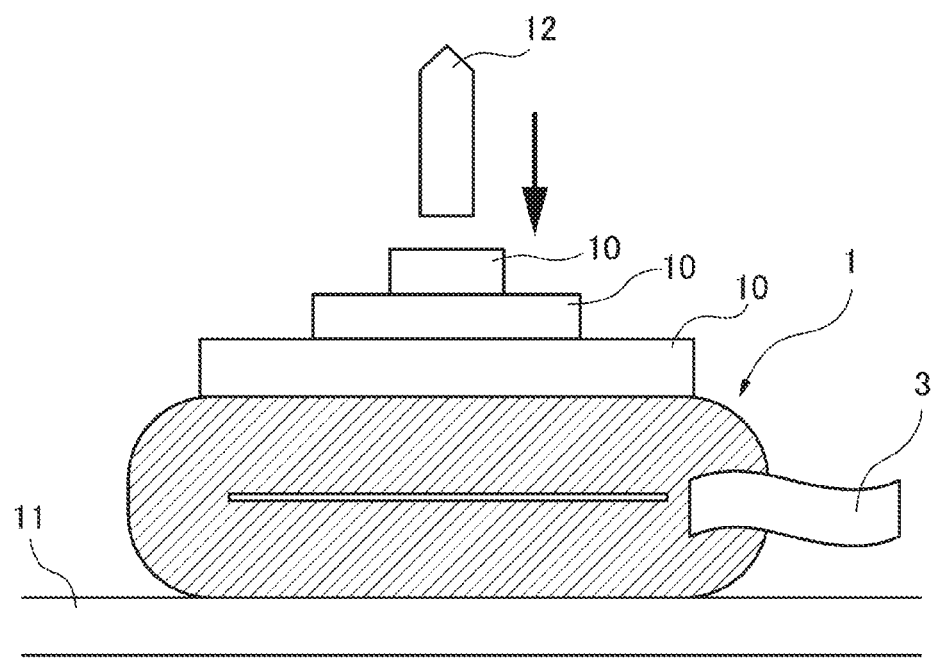
FIG. 3 is a drawing showing a method for evaluating a multilayer piezoelectric element.
Figure 4A:
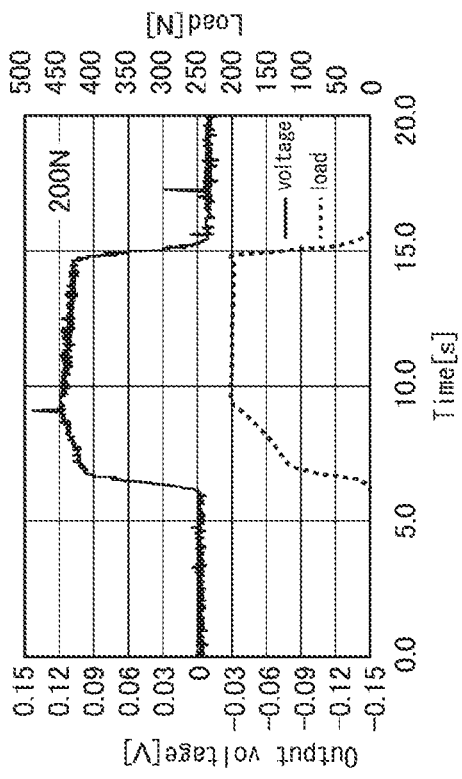
FIG. 4(a)-FIG. 4(d) depict drawings indicating the relationship between load and output voltage in Example 1.
Figure 4C:
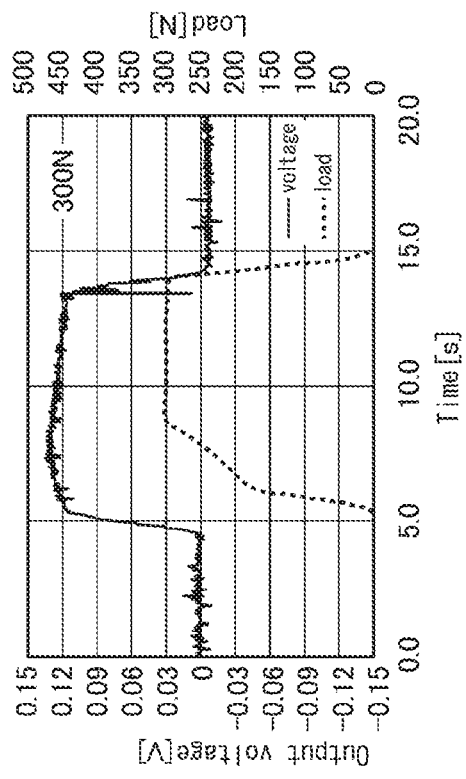
Figure 4B:
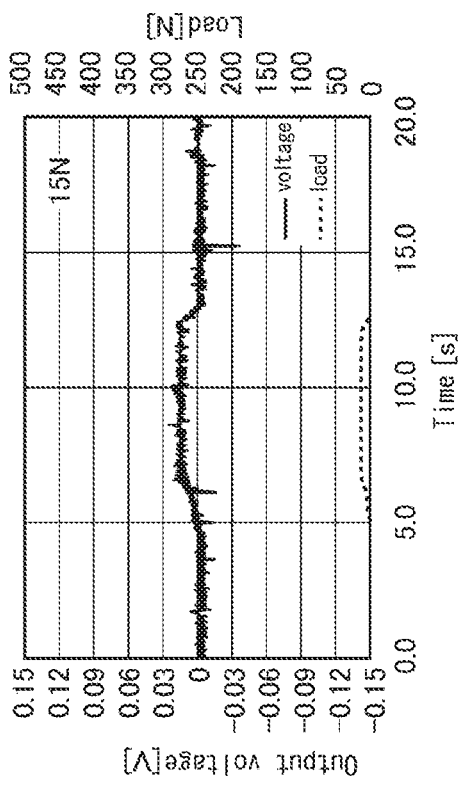
Figure 4D:
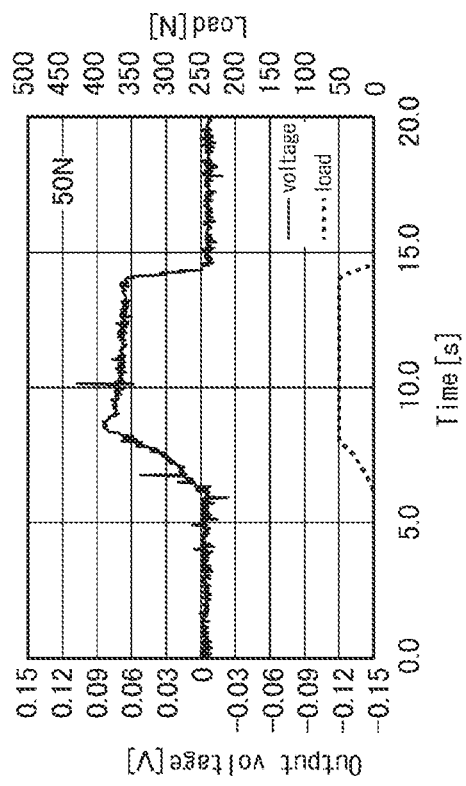

The multilayer piezoelectric element 1 was measured for output voltage during application of a load. Measurement consisted of placing the multilayer piezoelectric element 1 on a rigid body 11 with one of the flat surfaces facing downward as shown in FIG. 3, superimposing three acrylic plates measuring 50 mm×60 mm, 25 mm×30 mm and 12 mm×15 mm and having a thickness of 1.9 mm each on the upper flat surface, and applying a load in the direction of the arrow in the drawing with a load tester 12 so that a uniform load was applied to the entire flat surface.

Maintenance of output voltage by the multilayer piezoelectric element 1 and load response of the output voltage were evaluated based on the measurement results. Maintenance of output voltage was evaluated according to the reduction rate of output voltage while maintaining a constant load applied to the multilayer piezoelectric element 1 with the load tester 12. A reduction rate of output voltage at 5 seconds after the output voltage reached a maximum of 50% or less was evaluated with a A (average), that of 20% or less was evaluated with a G (good), and that of 10% or less was evaluated with a VG (very good). Load response of output voltage was evaluated by measuring output voltage while applying a constant load of 15 N, 50 N, 100 N, 200 N or 400 N to the multilayer piezoelectric element 1 and evaluating response based on the maximum value of output voltage at each load. The presence of a proportional relationship between the value of the load and the maximum value of output voltage over a range of 15 N to 40 N was evaluated with a VG, and the presence of a proportional relationship at low loads and output voltage becoming saturated as the load increases resulting in the proportional relationship no longer being observed at 400 N was evaluated with a G. The results are shown in Table 1.

FIGS. 4(a) to 4(d) indicate the results of measuring output voltage at a load of 10 MΩ when applying a static load having a peak of 15 N to 300 N to the multilayer piezoelectric element 1 of Example 1. In all of these measurements, output voltage from the multilayer piezoelectric element 1 increased in line with increases in the applied load, and output voltage became nearly constant when the load was fixed at the peak load. When the load was decreased after having continued to apply the peak load, output voltage decreased in line therewith, and when the load reached zero, output voltage also reached zero. Based on FIGS. 4(a) to 4(d), in the multilayer piezoelectric element 1 of Example 1, output voltage was determined to follow increases and decreases in an applied load, and when the applied load became constant, a substantially constant output voltage was continued to be obtained.

TABLE 1

| No. | No. of laminated layers (No. of windings) | Effective electrode diameter (mm) | Outside length (mm) | Inside length (mm) | Film width (mm) | Thickness (mm) | Hardness | Maintenance | Response |
|---|---|---|---|---|---|---|---|---|---|
| Ex. 1 | 1000 layers (500 times) | 50.0 | 75.0 | 53.0 | 54.0 | 20.0 | 98.5 | VG | VG |
| Ex. 2 | 100 layers (50 times) | 50.0 | 64.0 | 61.0 | 54.0 | 3.0 | 96.0 | A | G |
| Ex. 3 | 500 layers (250 times) | 15.0 | 64.0 | 53.0 | 19.0 | 10.5 | 97.2 | G | G |
| Ex. 4 | 900 layers (450 times) | 50.0 | 38.5 | 20.0 | 54.0 | 19.0 | 92.5 | VG | VG |
| Ex. 5 | 900 layers (450 times) | 50.0 | 39.0 | 20.0 | 54.0 | 18.9 | 88.5 | VG | VG |

In the case of a piezoelectric element of the prior art, output voltage in response to the application of an unchanging static load in the manner of a constant load is nearly zero. However, the multilayer piezoelectric element 1 is able to be realized in Example 1, allowing the obtaining of an output voltage in response to the application of a static load.

Figure 5A:
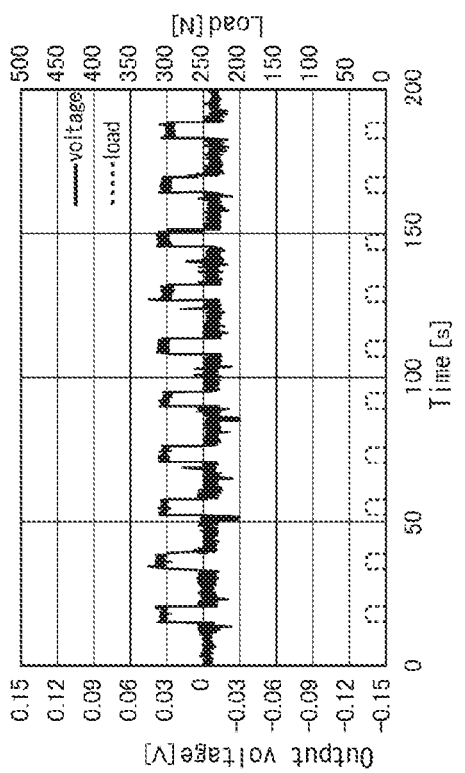
FIG. 5(a)-FIG. 5(d) depict drawings showing output voltage versus a repetitive load in Example 1.
Figure 5B:
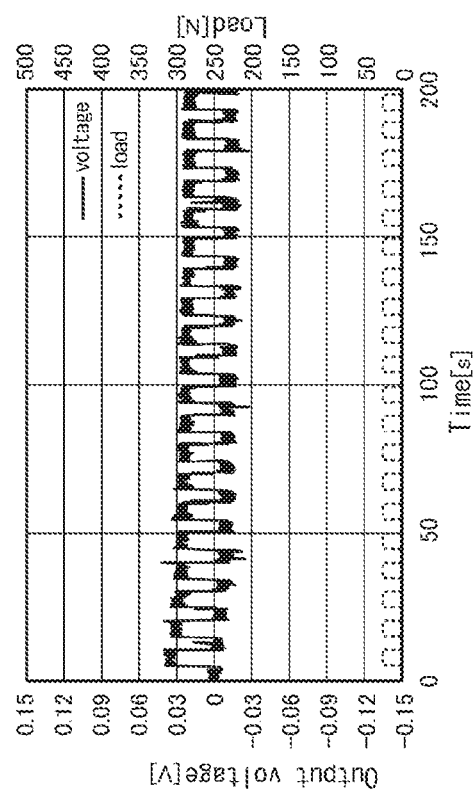
Figure 5C:
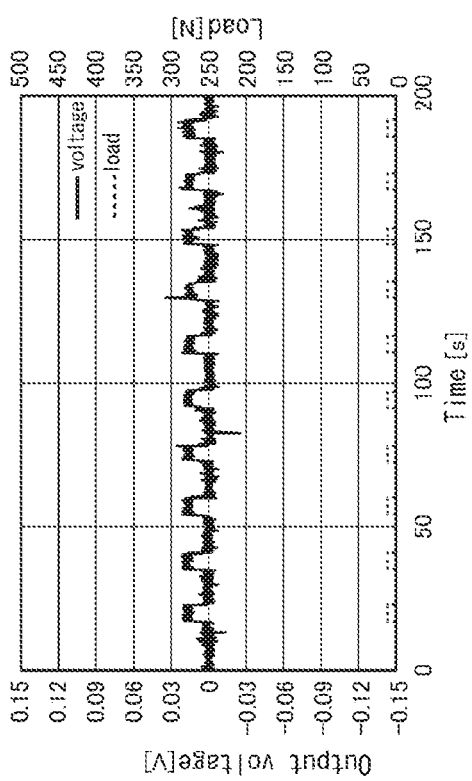
Figure 5D:
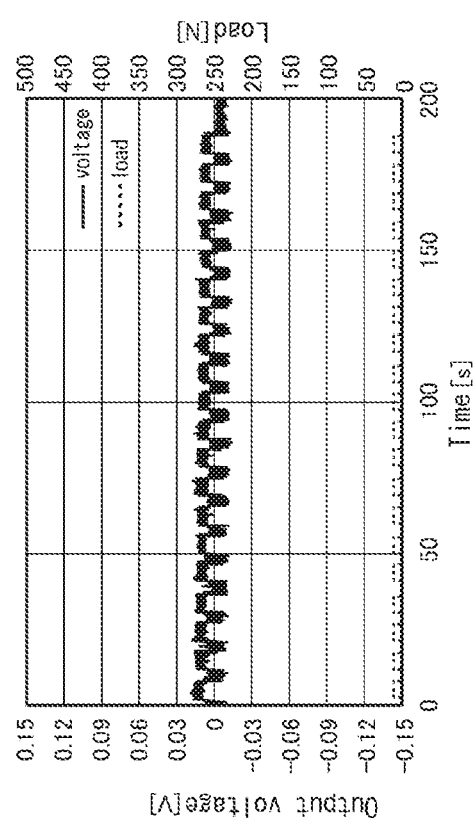

FIG. 5(a)-FIG. 5(d) indicate output voltage when a periodic load was applied to the multilayer piezoelectric element 1 of Example 1. FIGS. 5(a) and 5(c) indicate output voltage when a task consisting of applying a load of 10 N or 25 N, respectively, for 10 seconds was repeated 10 times. FIGS. 5(b) and 5(d) indicate the results when a task consisting of applying a load of 10 N or 25 N, respectively, for 5 seconds was repeated 20 times. In any of the results shown in FIGS. 5(a) to 5(d), the output voltage of the multilayer piezoelectric element changed periodically in line with periodic changes in the load. Output voltage was also determined to remain substantially constant during the time the load was constant.

(2) Examples 2 to 5

Multilayer piezoelectric elements 1 having the number of laminated layers, effective electrode width, exterior length, interior length, film width, thickness and hardness shown in Table 1 were produced as Examples 2 to 5. The production method consisted of superimposing a PLLA film, having a thickness of 9 µm and having the first conductive layer 4 formed on one side and the second conductive layer 6 formed on the other side by aluminum vapor deposition, with a PLDA film having a thickness of 9 µm followed by winding the multilayer film in the same manner as Example 1.

Examples 2 to 5 were measured for output voltage when an unfluctuating static load was applied. The results are shown in FIG. 6(a)-FIG. 6(d). FIGS. 6(a), 6(b), 6(c) and 6(d) indicate the measurement results for Examples 2, 3, 4 and 5, respectively. In Example 2, in which the number of laminated layers was 100, output voltage exhibited a strong tendency to decrease after the load became constant in comparison with other examples. However, a constant voltage was continuously output without the output voltage reaching zero, and a static load was able to be detected. In Example 3, in which the number of laminated layers was 500, and Examples 4 and 5, in which the number of laminated layers was 900, voltage was determined to be output more closely corresponding to the static load in comparison with Example 2. The results of evaluating maintenance and the load response of output voltage in Examples 2 to 5 in the same manner as Example 1 are shown in Table 1.

A stacked multilayer piezoelectric element not having a curved portion was produced for the sake of comparison followed by measurement of output voltage. 100 strips of PLLA film and PLDA film measuring 70 mm×30 mm and having a thickness of 9 µm were respectively prepared followed by forming the first conductive layer 4 on one side of the PLLA film and forming the second conductive layer 6 on the other side of the PLLA film by aluminum vapor deposition. After alternately laminating the PLLA film and PLDA film and adhering by thermal lamination, the first electrode 8 and the second electrode 9 were formed on the lateral surfaces in the lengthwise direction of the piezoelectric laminate by aluminum spraying (metallization) to obtain the stacked multilayer piezoelectric element of Comparative Example 1. The laminated structure of Comparative Example 1 employed the same structure as that shown in FIG. 2(b), consisting of the first conductive layer 4, the first piezoelectric polymer film layer 5, the second conductive layer 6 and the second piezoelectric polymer film layer 7, the number of laminated layers was 100 (number of laminated layers of PLLA film only), and the effective electrode area was 50 mm×30 mm. The average value of hardness in the center of Comparative Example 1 as determined by measuring three points with an Asker Durometer Type C (manufactured by Kobunshi Keiki Co., Ltd.) was 99.0.

Figure 7:
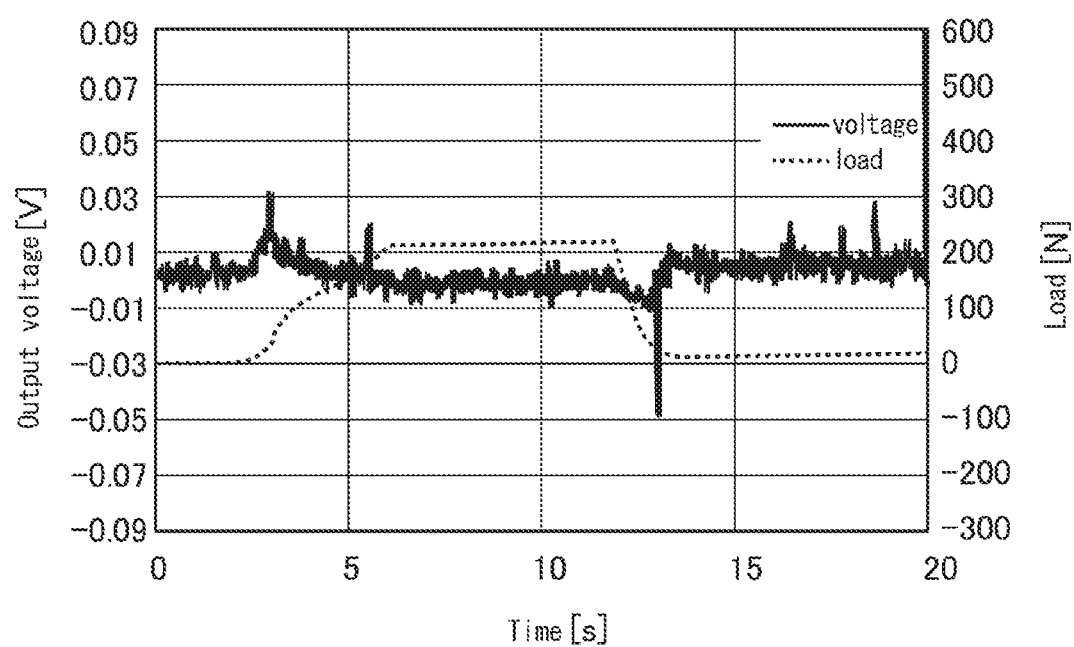
FIG. 7 is a drawing indicating the relationship between load and output voltage of a stacked multilayer piezoelectric element of a comparative example.

FIG. 7 indicates the results of measuring output voltage at a load of 10 MΩ when a load of 200 N was continuously applied to the stacked multilayer piezoelectric element of Comparative Example 1. In Comparative Example 1, output voltage when the load was constant at 200 N was nearly 0 V and an output voltage corresponding to the static load was unable to be obtained. In the case of Comparative Example 1 in the form of a stacked multilayer piezoelectric element not having a curved portion, an output voltage corresponding to a static load was unable to be obtained and a static load was unable to be detected. In contrast, in Examples 1 to 5 having a curved portion in a portion thereof, an output voltage corresponding to a static voltage was determined to be able to be obtained, thereby enabling use in applications such as static load sensors.

(3) Example 6

The cylindrical multilayer piezoelectric element of FIG. 1(a) was produced and evaluated as Example 6. The cylindrical multilayer piezoelectric element 1 having a void having a diameter of 12 mm in the center thereof was obtained by superimposing a PLLA film, having a film width of 54 mm and thickness of 9 µm, and a PLDA film having a having a film width of 54 mm and thickness of 9 µm, and winding the resulting multilayer film 150 times in the same manner as Example 1. The number of laminated layers of Example 6 was 300 layers and the effective electrode width was 50 mm. A cylindrical urethane rubber core 13 was provided in the void in the cylindrical center so that the multilayer piezoelectric element is not crushed even when a load is applied. The average value of hardness as determined by measuring three points with an Asker Durometer Type C (manufactured by Kobunshi Keiki Co., Ltd.) was 84.0.

Figure 8A:
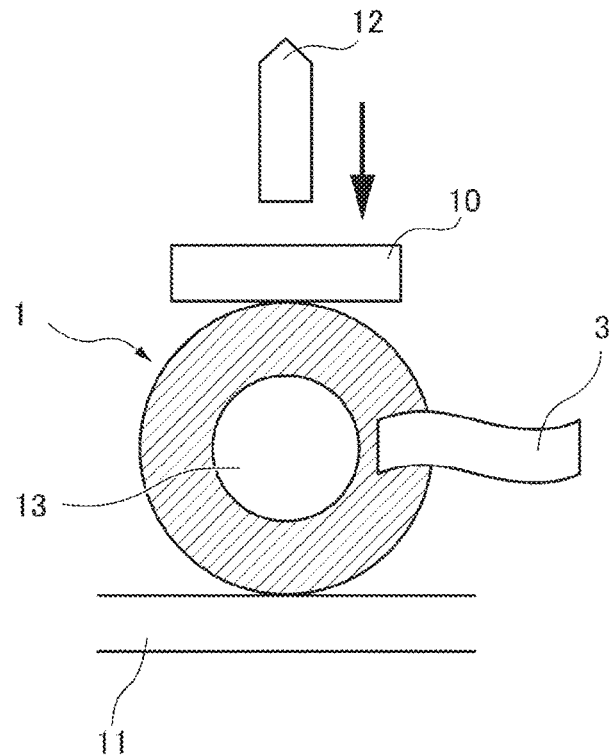
FIG. 8(a) and FIG. 8(b) depict drawings showing a cylindrical multilayer piezoelectric element and output voltage.
Figure 8B:
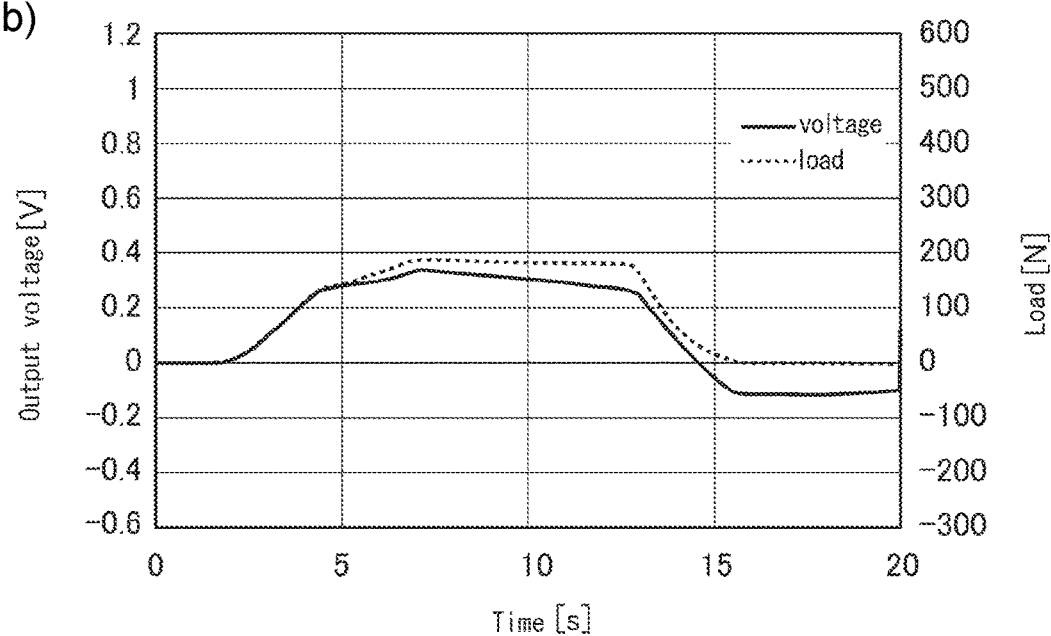

The multilayer piezoelectric element of Example 6 was placed on the rigid body 11 as shown in FIG. 8(a), an acrylic plate 10 was arranged on the upper portion thereof and a load was applied in the direction of the arrow with the load tester 12. The results of applying a load of 200 N with the load tester 12 and measuring output voltage at a load of 10 MΩ are shown in FIG. 8(b). The output voltage from the multilayer piezoelectric element of Example 6 increased in line with the increase in the load, and a substantially constant output voltage was continued to be output when the load became constant at 200 N. Subsequently, output voltage decreased correspondingly when the load was reduced. The cylindrical multilayer piezoelectric element 1 was also determined to output voltage corresponding to a static load and be able to be used in applications such as a static load sensor.

Figure 9:
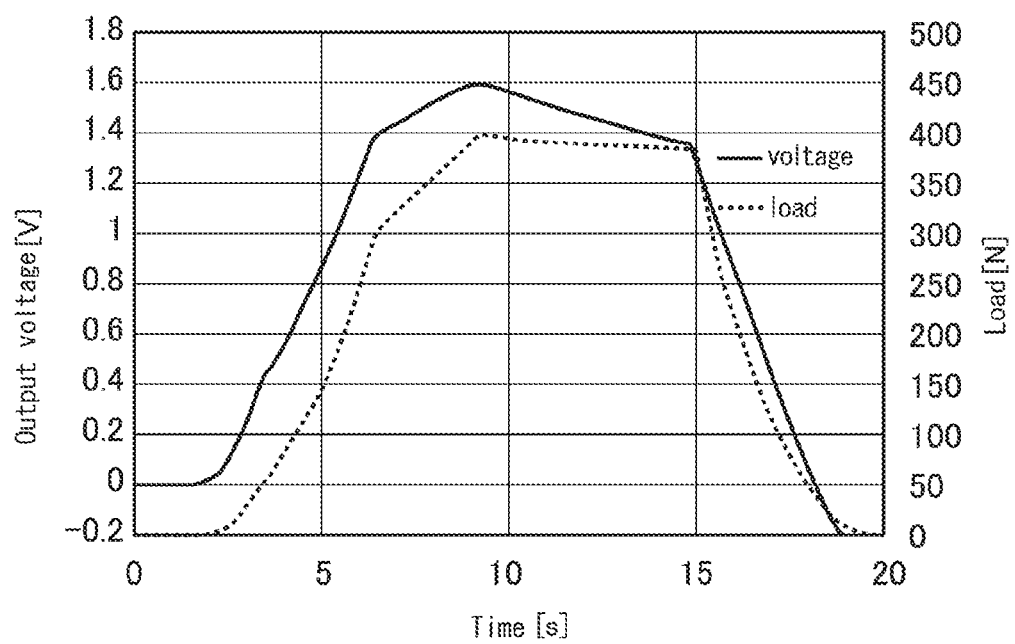
FIG. 9 is a drawing showing output voltage when two multilayer piezoelectric elements are connected in series.

FIG. 9 indicates the measurement results obtained when the multilayer piezoelectric element 1 of Example 5 was superimposed on the multilayer piezoelectric element 1 of Example 4 on a rigid body followed by the application of a load of 400 N to the flat surface of Example 5 with a load tester. Example 4 and Example 5 were electrically connected in series followed by measurement of output voltage at a load of 10 MΩ.

Figure 6A:
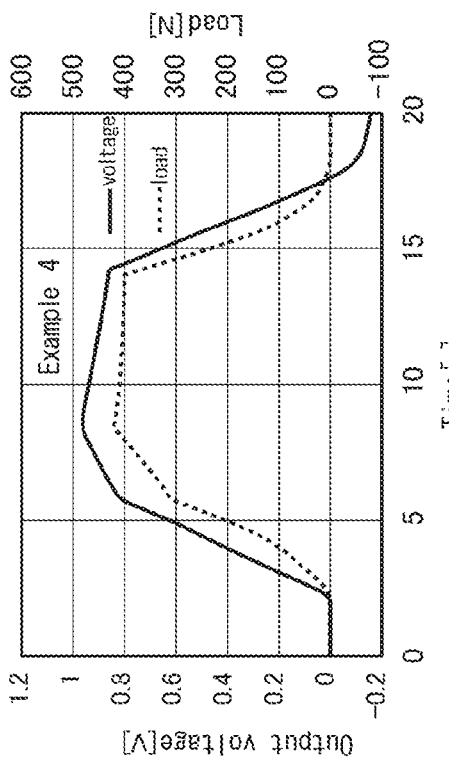
FIG. 6(a)-FIG. 6(d) depict drawings indicating the relationship between load and output voltage in Examples 2 to 5.
Figure 6B:
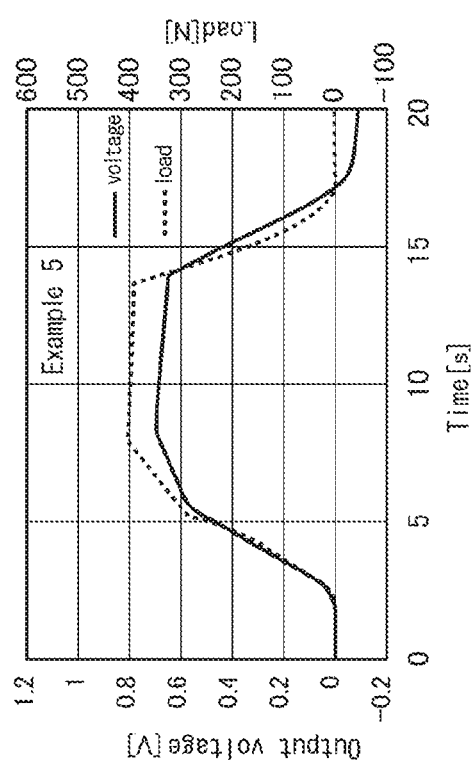
Figure 6C:
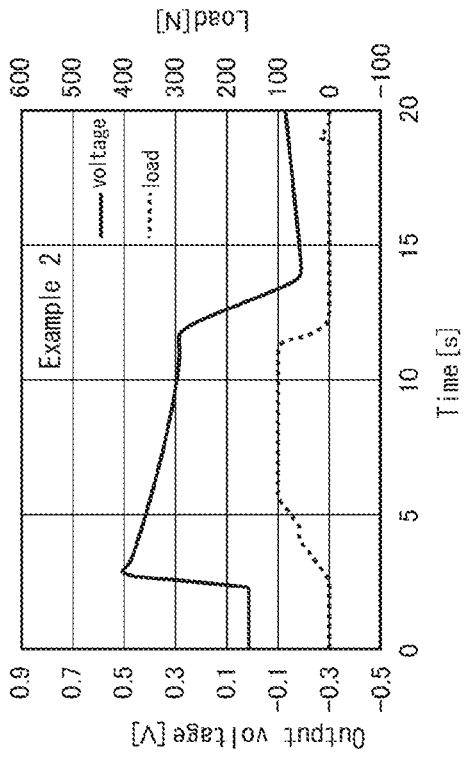
Figure 6D:
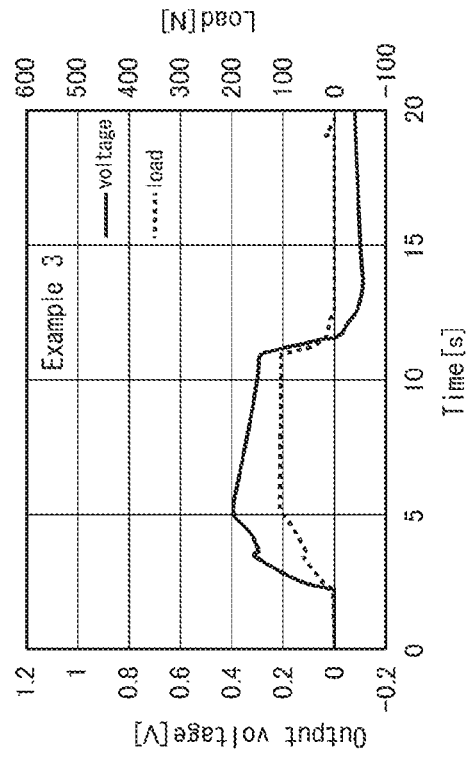

The output voltages when a load of 400 N was applied to Example 4 and Example 5 separately were about 1 V and about 0.7 V as shown in FIGS. 6(c) and 6(d). FIG. 9 indicates that an output of 1.6 V was obtained as a result of connecting Example 4 and Example 5 in series. Since it is difficult to align phase in the case of conventional piezoelectric elements due to the instantaneous output, even if a plurality of piezoelectric elements is connected in series, it is difficult to obtain an output voltage that is larger than that of the individual piezoelectric elements. However, in the case of the multilayer piezoelectric element of the present invention, since an output is obtained continuously following the application of a static load, the application of a static load after having connected a plurality of multilayer piezoelectric elements in series facilitates the obtaining of an output voltage that is larger than that of individual elements.

Since the multilayer piezoelectric element 1 of Examples 1 to 6 allows the output of a voltage even in response to a static load, use of the multilayer piezoelectric element 1 as a load sensor makes it possible to realize a load detection system having a simple circuit configuration. Thus, the present invention also relates to the use of the multilayer piezoelectric element as a load sensor and a method for the use thereof. In the case of using the multilayer piezoelectric element 1 as a load sensor, that load sensor includes an element such as wiring for accessing signals from the multilayer piezoelectric element, and a detection device and the like. In addition, the multilayer piezoelectric element demonstrates higher strength and superior durability than a piezoelectric polymer film alone and is at little risk of damage even when a large load is applied. For example, if the multilayer piezoelectric element of the present invention is used for the support pedestal of a seat, the multilayer piezoelectric element is able to distinguish between a signal representing the state in which a constant load is applied for several seconds or more as a result of a person sitting on the seat and a noise signal generated due to the application of an impact such as when the seat has been kicked based on the output signal of the multilayer piezoelectric element 1.

In addition, if the multilayer piezoelectric sensor is provided as a load sensor on the bottom of a shoe, signals generated when running and signals generated when walking can be distinguished based on the amount of time the output voltage continues.

Moreover, since the multilayer piezoelectric element of the present invention allows the obtaining of an output voltage according to a static load, it can also be used as an energy harvesting device that converts low cycle vibrations to electrical energy, an application for which these elements have not been used in the past. Thus, the present invention also relates to the use of the multilayer piezoelectric element as an energy harvesting device or power supply and a method for the use thereof. In particular, since voltage is added simply by connecting a plurality of multilayer piezoelectric elements in series without having to provide a rectifier circuit or phase matching circuit, the multilayer piezoelectric element can be used as a power supply generating a large output voltage.

Although the above has provided a detailed description of preferred embodiments of the present invention, the present invention is not limited to the aforementioned embodiments and can be modified or altered in various ways within the scope of the present invention as described in the claims.

REFERENCE SIGNS LIST

1 Multilayer piezoelectric element
2 Piezoelectric laminate
3 Lead-out electrode
4 First conductive layer
5 Piezoelectric polymer film layer, first piezoelectric polymer film layer
6 Second conductive layer
7 Insulating layer, second piezoelectric polymer film layer
8 First electrode
9 Second electrode
10 Acrylic plate
11 Rigid body
12 Load tester
13 Urethane rubber core

The invention claimed is:

1. A multilayer piezoelectric element comprising a laminate obtained by laminating a plurality of layers of a piezoelectric polymer film layer that exhibits piezoelectric properties in the planar direction of the film,
   wherein the laminate is a wound laminate in which a first conductive layer, the piezoelectric polymer film layer, a second conductive layer and an insulating layer are wound,
   wherein the piezoelectric polymer film layer and the insulating layer are film layers composed of an optically chiral polymer, and
   the laminate is layered so that the direction indicating piezoelectric properties when a voltage is applied to the piezoelectric polymer film layer and the direction indicating piezoelectric properties when a voltage opposite of that voltage is applied to the insulating layer are in the same direction, and
   wherein the output voltage follows an increase or decrease of a load applied to the laminate, and the output voltage is substantially constant when the applied load is constant.

2. The multilayer piezoelectric element according to claim 1, wherein the cross-section of the piezoelectric polymer film layer at least has a curved portion.

3. The multilayer piezoelectric element according to claim 2, wherein the cross-section of the piezoelectric polymer film layer has the curved portion and a linear portion continuous with the curved portion.

4. The multilayer piezoelectric element according to claim 1, wherein the piezoelectric polymer film layer is a poly(L-lactic acid) film layer and/or a poly(D-lactic acid) film layer.

5. The multilayer piezoelectric element according to claim 1, wherein a first electrode exhibiting electrical continuity with the first conductive layer is formed on one of the lateral surfaces of the wound laminate, and a second electrode exhibiting electrical continuity with the second conductive layer is formed on the other lateral surface of the wound laminate.

6. The multilayer piezoelectric element according to claim 1, wherein the central portion of the wound laminate does not have a space.

7. The multilayer piezoelectric element according to claim 1, wherein the central portion of the wound laminate has a space.

8. The multilayer piezoelectric element according to claim 1, wherein a core member is inserted into the central portion of the wound laminate.

9. The multilayer piezoelectric element according to claim 1, wherein the hardness of the laminate as measured with an Asker Durometer Type C manufactured by Kobunshi Keiki Co, Ltd. is within the range of 70 to 100.

10. The multilayer piezoelectric element according to claim 1, wherein the number of layers of the piezoelectric polymer film layer is 80 layers or more.

11. A load sensor comprising the multilayer piezoelectric element according to claim 1 and a detection device connected to the multilayer piezoelectric element that detects the output thereof.

12. A power supply comprising the multilayer piezoelectric element according to claim 1.

* * * * *